(12) United States Patent
Hranjec

(10) Patent No.: US 12,464,662 B2
(45) Date of Patent: Nov. 4, 2025

(54) SCROLLING DISPLAY APPARATUS AND METHOD OF USE

(71) Applicant: Peter Hranjec, Conshocken, PA (US)

(72) Inventor: Peter Hranjec, Conshocken, PA (US)

( * ) Notice: Subject to any disclaimer, the term of this patent is extended or adjusted under 35 U.S.C. 154(b) by 331 days.

(21) Appl. No.: 18/356,883

(22) Filed: Jul. 21, 2023

(65) Prior Publication Data

US 2024/0032221 A1    Jan. 25, 2024

Related U.S. Application Data

(60) Provisional application No. 63/474,123, filed on Jul. 21, 2022.

(51) Int. Cl.
*H05K 5/02* (2006.01)

(52) U.S. Cl.
CPC ......... *H05K 5/0217* (2013.01); *H05K 5/0247* (2013.01)

(58) Field of Classification Search
CPC ........................... H05K 5/0017; H05K 5/0217
USPC ....................................................... 361/807
See application file for complete search history.

(56) References Cited

U.S. PATENT DOCUMENTS

| | | | | |
|---|---|---|---|---|
| 3,664,050 A | * | 5/1972 | Manzano | G09F 11/26 40/472 |
| 5,138,781 A | * | 8/1992 | Claver | G09F 11/15 40/524 |
| 5,598,651 A | * | 2/1997 | Aiken | G09F 11/21 40/518 |
| 5,687,498 A | * | 11/1997 | Keyser | G09F 11/21 40/518 |
| 2021/0076517 A1 | * | 3/2021 | Wang | H05K 5/0217 |

* cited by examiner

*Primary Examiner* — Hung S. Bui
(74) *Attorney, Agent, or Firm* — The Pollock Group; Michael A. Pollock

(57) ABSTRACT

A display apparatus comprising a frame with a display opening and a first and second side and a central portion therebetween, a first scroll display set comprised of a first mated roller set of a first roller and second roller and first imaged scroll, whereby the first roller and second roller are rotatably mounted in the frame on the first side and second side of the frame, respectively; and the first imaged scroll is wound around the first mated roller set, whereby the wound first scroll couples in rotation with the first mated roller set in an innermost orbit of the frame; and a second scroll display set with of a second mated roller set of a third roller and a fourth roller and second imaged scroll, the second display set mounted outside the innermost first roller set with the second imaged scroll wound around the second mated roller set to provide coupled rotation on an inner more orbit of the frame; and a drive to provide motion of at least one roller; and at least one of a guide and a lead to guide the scrolls.

32 Claims, 15 Drawing Sheets

SCROLLING DISPLAY APPARATUS AND METHOD OF USE

CROSS-REFERENCE TO RELATED APPLICATION

The present application claims priority from Provisional Patent Application Ser. No. 63/474,123, filed on Jul. 21, 2022 which is incorporated herein by reference in entirety Field of the Invention.

BACKGROUND OF THE INVENTION

Field of the Invention

The present invention relates to a scrolling display apparatus and method of use.

Background

Historically, and in current times, people enjoy modern forms of art as a hobby and pastime leading to education, entertainment, fascination, the building of technology skills, a profession, fun, laughter, meeting new people etc. While there are many types of modern art forms that offer such experiences to users, a dynamic multi-scroll scrolling display apparatus where custom art is displayed on moving scrolls of different layers with interaction between the scrolls does not currently exist.

SUMMARY OF THE INVENTION

This summary is an introduction of concepts which are further discussed in the Detailed Description. This summary is not intended to identify key features or essential features of the claimed subject matter, nor is it intended to be used to limit the scope of the claimed subject matter.

Art forms are common throughout the United States and around the world, and include artforms such as pictures, prints, paintings, clocks, skeleton clocks, digital displays, antiques, statues, mechanical objects and displays and the like. These art forms are enjoyed by many people including hobbyists, collectors, innovators and artists and can be found in homes, offices, art galleries, public display areas and in private collections. These art forms can provide a great source of entertainment for people of all ages and types. These artforms can also provide mental stimulation and education, as well as a great way for various groups of people to enjoy collectively, break the ice with, and as a way to meet new people in a fun environment.

Additionally, with the large number of entertainment options available today, many of which are digital, it becomes difficult and expensive to find new ways to entertain and educate people in the United States and around the world. The present invention provides a fun and educational art display apparatus and method of use which entertains observers about the artistry of the interacting moving art scrolls. This can also provide a fun way for art enthusiasts to interact in a fun environment.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
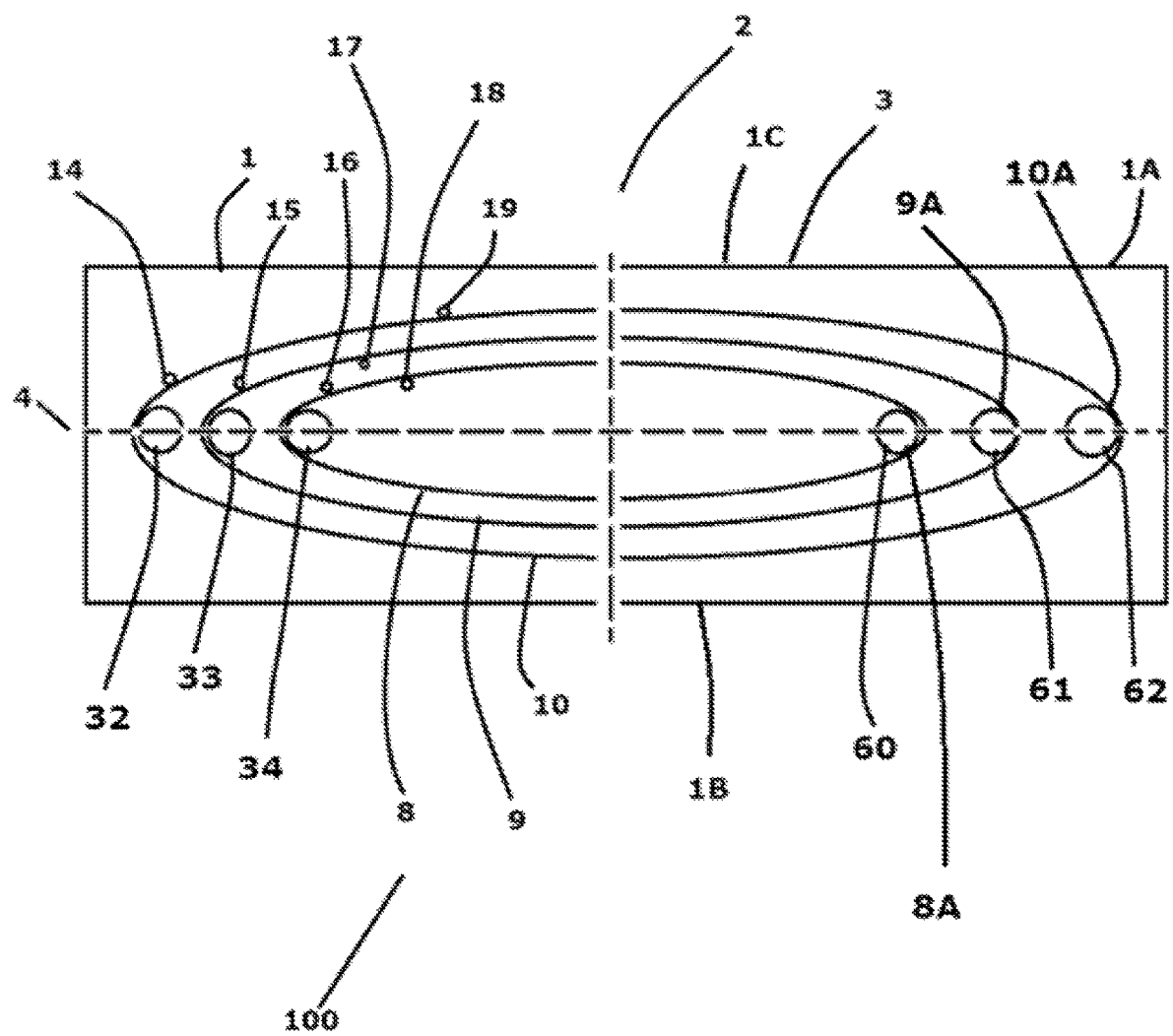
FIG. 1 is a top schematic view of a scrolling display apparatus according to the exemplary embodiment of the present invention.

In the drawings, like numerals indicate like elements throughout. Certain terminology is used herein for convenience only and is not to be taken as a limitation on the present invention. The terminology includes the words specifically mentioned, derivatives thereof and words of similar import. The embodiments illustrated below are not intended to be exhaustive or to limit the invention to the precise form disclosed. These embodiments are chosen and described to best explain the principle of the invention and its application and practical use and to enable others skilled in the art to best utilize the invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Unless explicitly stated otherwise, each numerical value and range should be interpreted as being approximate as if the word "about" or "approximately" preceded the value of the value or range.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

For purposes of this description the terms "connected," "linked," "attached," "associated," "united," "coupled," "joined," "combined," "banded," others not mentioned here, refer to any manner known in the art or later developed wherein any item or items are brought together into contact or association in some respect. Additionally, the interposition of one or more additional elements may be contemplated, although not required. Conversely, the terms "directly coupled," "directly connected," etc., imply the absence of such additional elements.

Additionally, for purposes of this description, the terms "process," "system," "method," "operation," are used to describe at least one of a system and method capable of at least one of performing a series of actions or steps taken in order, or generally, in order to achieve a particular result. Additionally, for purposes of this description, the terms "process" and "method" are used interchangeably.

For additional purposes of this description, "wall," "side," "face," "surface," may be used to define a portion of a component, such as an outside surface, inside surface, a horizontal or vertical surface, others not mentioned here.

For additional purposes of this description, "cable," "cord," "string," "rod" "strap" "cable" "strap" "rope" "wire" "band" "elongate" may be used to describe or generally describe the configuration of a lead used in the present invention.

For additional purposes of this description, "bearing," "bushing," "ball bearing" "friction reducing element" "roller bearing" "needle bearing" "sleeve" may be used to describe or generally describe the configuration of a friction reducing component as used in the present invention.

Referring FIG. 1 in this exemplary embodiment, a top schematic view of a scrolling display apparatus 100 is shown having inner most mounted first scroll display set 8A and inner more mounted second scroll display set 9A, and an additional and third scroll display set 10A mounted outside of second scroll set 9A. Scrolling display apparatus 100 could a single set display set or any plurality of scroll display sets.

Further referring FIG. 1, scrolling display apparatus 100 is also comprised of frame 1A and front wall 1B and a back wall 1C and a first side 1 on the left side and a second side 3 on the right side and central portion 2 in the center interposed between the first side 1 and second side 3. Also referring FIG. 1, scrolling display apparatus 100 comprises mated first roller 34 and second roller 60 and first scroll 8, mated third roller 33 and fourth roller 61 and second scroll 9, and mated roller 32 and roller 62 and at least one additional scroll segment 10, in this case, third scroll segment 10. First scroll 8 and second scroll 9 and the additional and third scroll set 10, in the current exemplary embodiment, each have an interior and exterior face such as further illustrated in FIG. 2.

In this present exemplary embodiment, at least one portion of the front of scrolling display apparatus 100, such as front wall 1B of FIG. 1, has at least one of some level of transparency and a viewing opening formed therein. This at least some level of transparency and possessing a viewing opening formed therein is to provide any observer of display apparatus 100 the ability to view any scroll of display apparatus 100, such as art provided on at least one of first scroll 8 and second scroll 9 and at least additional scroll segment 10 of FIG. 1. Some level of display apparatus 100 being transparent may describe any level of translucency, ranging from fully transparent and/or clear to being at least one of opaque and very opaque and barely able to see through and others not mentioned here. Further, any portion of display apparatus 100 may be transparent.

Referring FIG. 1, first scroll display set 8A is comprised of the first mated roller set of roller 34 and second roller 60, whereby first roller 34 is rotatably mounted inner most of first side 1 of frame 1A shown on the left portion of scrolling display apparatus 100, and second roller 60 is rotatably mounted inner most on the second side 3 of frame 1A on the right portion of scrolling display apparatus 100 relative to central portion 2. Both roller 34 and roller 60 have outer roller surfaces, with first scroll 8 wound around the outer surface of at least one of roller 34 and roller 60 as shown in FIG. 1. Further referring FIG. 1, roller 34 and roller 60 and first scroll 8 couple and/or couples in pulley rotation when any of roller 34 and roller 60 and first scroll 8 are at least on of in motion and rotated. In the present invention, couples in pulley rotation refers to at least one of being in motion together and connected together and rotating together and moving together and others not mentioned here.

Figure 1A:
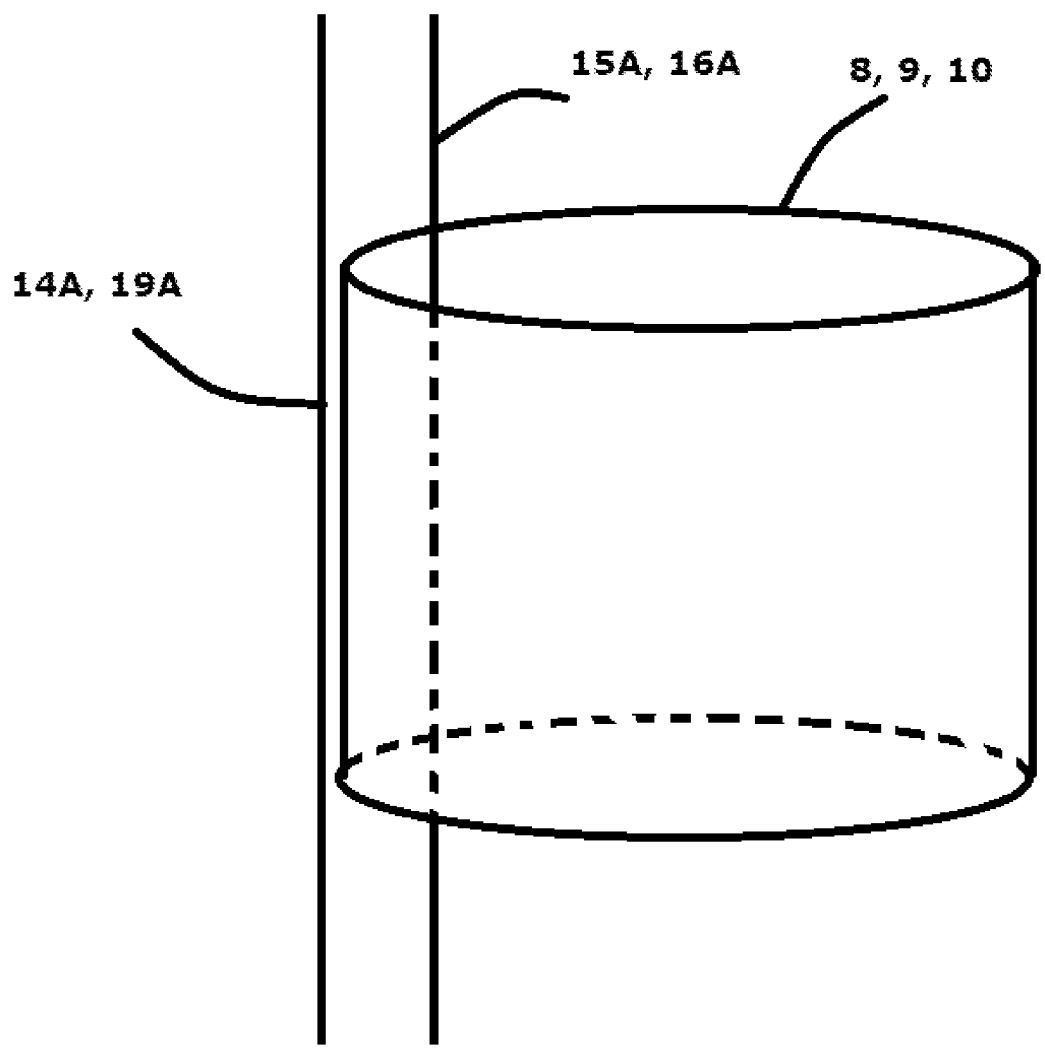
FIG. 1A is a side view of exemplary leads traversing therethrough and outside of an exemplary scroll in the present invention.
Figures 1B, 1C:
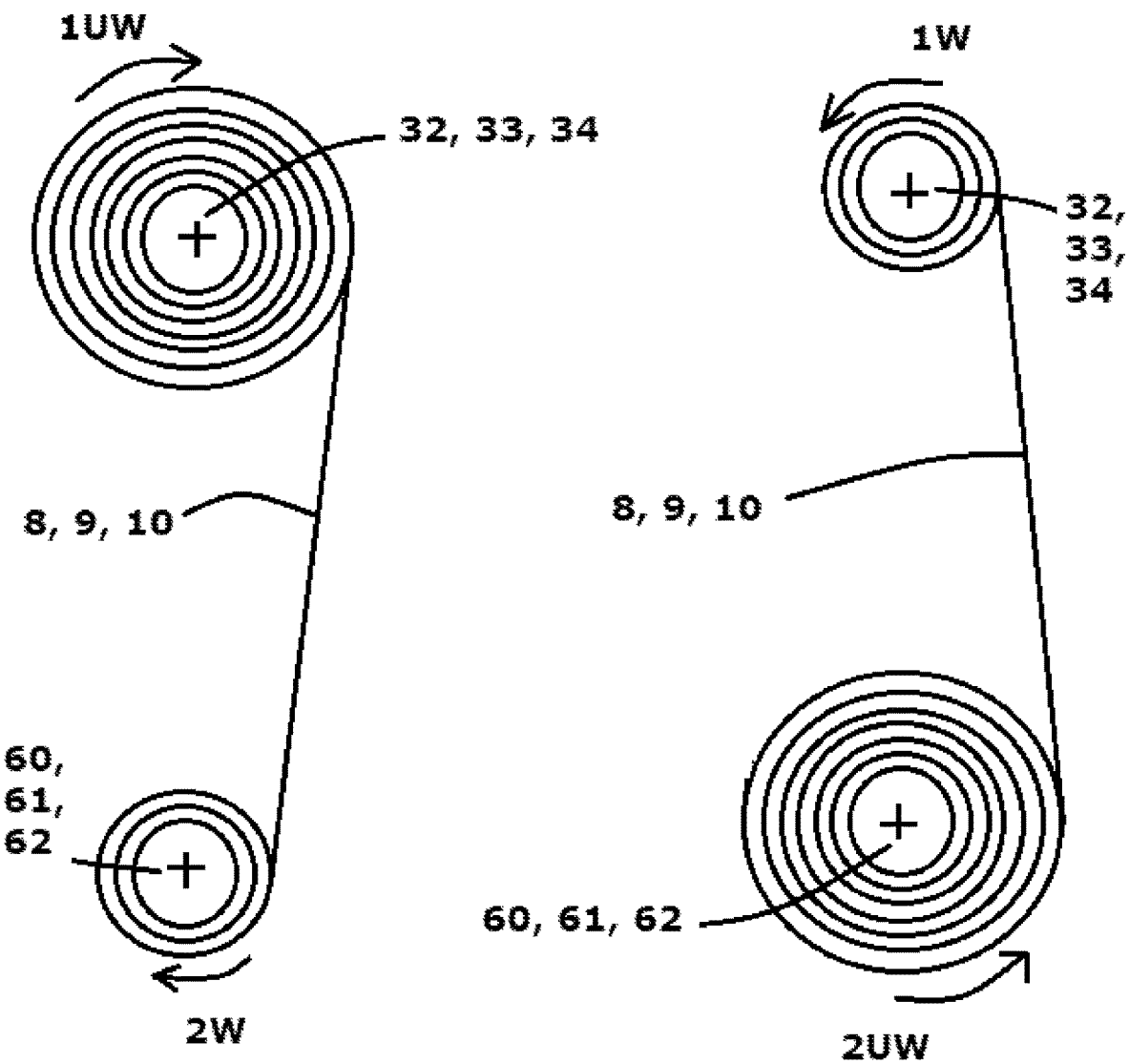
FIG. 1B and FIG. 1C are top views of scrolls winding and unwinding thereto and therefrom rollers in an exemplary embodiment of the present invention.

Referring FIG. 1, first display set 8A, in this first exemplary embodiment, is at least one of located in an inner most orbit and in motion in an inner most orbit about the central portion 2 of frame 1A as shown. As used in this first exemplary embodiment, wound may be described as at least one of wrapped around and wound around and looped around and connected in series with and coupled and integral and connected in series and others not mentioned here. Referring FIG. 1B, any display set of display apparatus 100 consisting of a mated roller and scroll set, such as rollers 32 and 62 and third scroll 10, rollers 33 and 61 and second scroll 9, and rollers 34 and 60 and first scroll 8, may be coupled by the winding of the scroll onto one of the rollers of the mated set while unwinding the scroll from the other roller of the mated set. In FIG. 1B, a scroll such as scroll 8, 9, and 10, is shown unwinding 1UW from a roller such as 32, 33 and 34, and winding 2W onto a roller such as roller 60, 61 and 62 respectively. Alternately, in FIG. 1C, a scroll such as scroll 8, 9, and 10 is shown unwinding 2UW from a roller such as roller 60, 61 and 62 and 34 and winding 1W onto a roller such as roller 32, 33 and 34 respectively.

Referring FIG. 1, second scroll display set 9A is mounted outside innermost first scroll display set 8A, and is comprised of the second mated roller set of third roller 33 and fourth roller 61, whereby both third roller 33 and fourth roller 61 have outer roller surfaces, and whereby second scroll 9 is wound around the outer surface of at least one of third roller 33 and fourth roller 61. Outside of, as used in this exemplary embodiment, describes outside relative to the central portion of display apparatus 100, such as scroll display set 9A being mounted further away from central portion 2 in relation to scroll display set 8A.

Further referring FIG. 1, third roller 33 and fourth roller 61 are rotatably mounted in frame 1A outside of the inner most first mated roller set of roller 34 and roller 60, with third roller 33 rotatably mounted at least one of outside of and immediately outside of first roller 34 on the left portion of scrolling display apparatus 100, and whereby fourth roller 61 is rotatably mounted at least one of outside of and immediately outside of second roller 60 on the right portion of scrolling display apparatus 100, relative to central portion 2. Referring FIG. 1, third roller 33 and fourth roller 61 and second scroll 9 couple and/or couples in pulley rotation when any of roller 33 and roller 61 and second scroll 9 are at least on of in motion and rotated. Second display set 9A, in this first exemplary embodiment, is at least one of located outside and in orbit outside the inner most orbit of first display set 8A, about the central portion 2 of frame 1A as shown in FIG. 1A.

At least one additional scroll display set 10A of display apparatus 100 is shown as a third scroll display set 10A in FIG. 1. This at least one additional scroll display set 10A, also referred herein to as third scroll display set 10A in the current exemplary embodiment of FIG. 1, is comprised of the mated roller set of prime roller 32 and secondary roller 62, which are mounted outside inner more second scroll display set 9A. Specifically, and further referring FIG. 1, prime roller 32 and secondary roller 62 are rotatably mounted in frame 1A outside of inner more third roller 33 and inner more fourth roller 61, respectively. Both prime roller 32 and second are roller 62 have outer roller surfaces, whereby at least one additional scroll segment 10 is wound around the outer surface of at least one of prime roller 32 and secondary roller 62. Prime roller 32 and secondary roller 62 and at least one additional scroll segment 10, representing at least one additional scroll display set 10A of scrolling display apparatus 100 as shown in FIG. 1, couples in pulley rotation when any of prime roller 32 and secondary roller 62 and at least one additional scroll segment 10 are at least on of in motion and rotated. At least one additional display set 10A, in this first exemplary embodiment, is at least one of one of located and in motion and in orbit outside of the inner more orbit of the second scroll display set 9A about the central portion 2 of frame 1A as shown in FIG. 1A.

The ability for scroll display apparatus 100 to develop at least one of motion and rotation of any roller and/or scroll of scroll display apparatus 100 is provided by a drive, such as electrical or mechanical drive directly and/or indirectly coupled to any portion of any roller and any scroll or scroll segment of display apparatus 100.

The terms prime as used in prime roller 32, secondary as used in secondary roller 62, and additional scroll segment 10 of the at least one additional scroll display set 10A of FIG. 1, are used to illustrate that any additional display set may be added to display apparatus 100, whereby mated rollers couple to any additional scroll segment, such as accomplished by prime roller 32 and secondary roller 62 and additional scroll segment 10. Any number of additional display sets can be added outside any inner more display set of scrolling display apparatus 1 to provide scroll art to scrolling display apparatus 100 in the current exemplary embodiment.

Referring FIG. 1, first scroll 8 and second scroll 9 and third scroll 10 each have independent internal faces and external faces, whereby the internal face of any scroll is at least one of inward facing and located on the inner face inside the orbit of that display set. Alternately, the external face of any scroll is at least one of the outer face and facing outwards of apparatus 100, such as outwards from center portion 2 of FIG. 1.

Referring FIG. 1, external lead 14 traverses outside of and contacts at least one portion of the exterior face of third scroll segment 10. Further referring FIG. 1, internal lead 19 is shown traversing therethrough and in contact with the interior face of third scroll 10. Also referring FIG. 1, external lead 15 traverses outside of and contacts the exterior face of second scroll 9, and interior lead 17 traverses therethrough and contacts the interior face of the second scroll 9. Further referring FIG. 1, external lead 16 traverses outside of and contacts the exterior face of the first scroll 8, and interior lead 18 is shown traversing therethrough and contacting the interior face of the first scroll 8. In the current exemplary embodiment, leads are mounted such as to frame 1A to provide guidance and positioning to at least one of first scroll 8 and second scroll 9 and any additional scroll segment of scrolling display apparatus 100, such as third scroll segment 10 of FIG. 1. Further in the current exemplary embodiment, any lead may be used to increase the tension on any scroll, such as first scroll 8 and second scroll 9 and third scroll 10 of FIG. 1. The contact of a lead thereto a scroll, such as first scroll 8 and second scroll 9 and third scroll 10 is generally used to transmit force unto the scroll being contacted to at least one of position and alter the tension thereof the contacted scroll.

Referring FIG. 1A, examples of leads 14A and 19A are shown as external leads traversing the length outside of the illustrated scroll, such as at least one of first scroll 8 and second scroll 9 and third scroll 10. Leads 14A and 19A, in the current example, would be in contact with the outer surface of any scroll such a lead is guiding, such as at least one of first scroll 8 and second scroll 9 and third scroll segment 10. Alternately, leads 15A and 16A are shown traversing therethrough and in contact with internal faces of first scroll 8 and second scroll 9 and third scroll segment 10. Further referring FIG. 1A for the current exemplary embodiment, the tension in any lead of scrolling display apparatus 100, such as at least one of lead 14A and lead 19A and lead 15A and lead 16A as illustrated, can be altered to increase and decrease at least one of force and tension of any scroll and/or scroll segment, such as first scroll 8 and second scroll 9 and third scroll segment 10.

Further referring FIG. 1, the first roller 34 has an outer roller surface, second roller 60 has an outer surface, third roller 33 has an outer surface, fourth roller 61 has an outer surface, prime roller 32 has an outer surface, and secondary roller 62 has an outer surface. The outer surfaces any roller of display apparatus 100 may optionally include at least one of an anti-friction element and a friction element such as a lubricant, elastomer, adhesive, rubber lobster claw bands, rubber bands, rubber coating and others not mentioned here. An example of a friction element added to any roller of display apparatus 100 is shown in FIG. 4E, where rubber bands 60A have been added to the outer surface of a roller, such as at least one of roller 32, 33, 34, 60, 61 and 62 of the current exemplary embodiment, to aid in providing at least one of friction and smooth operating engagement between any roller and any scroll of display apparatus 100.

Figure 2:
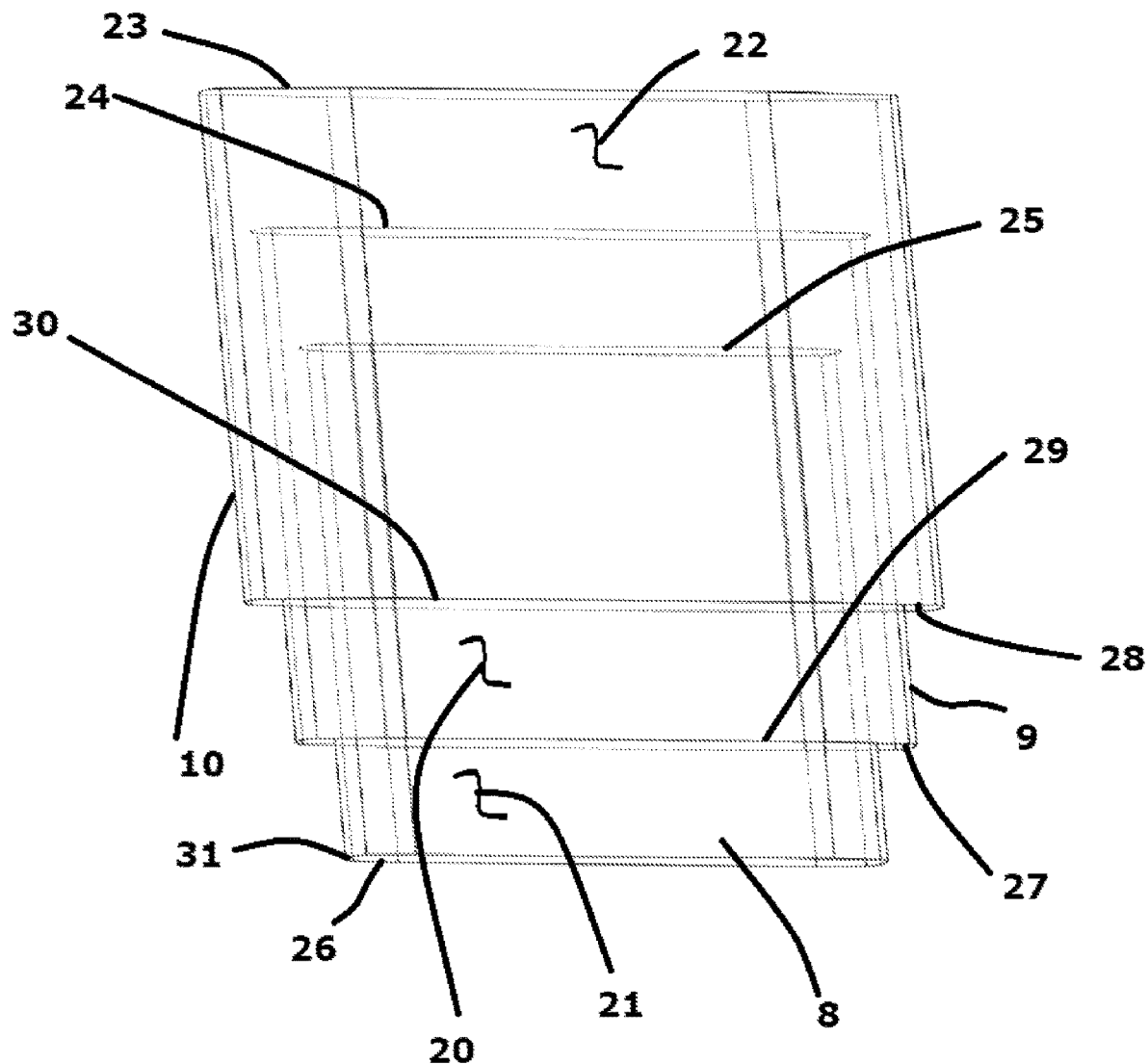
FIG. 2 is a front perspective view of three scrolls of a scrolling display apparatus according to an exemplary embodiment of the present invention.

Referring FIG. 2, first scroll 8 is on the inner most orbit of scrolling display apparatus 100, and second scroll 9 is outside of first scroll 8 on an inner more orbit of scrolling display apparatus 100. At least one additional scroll segment 10, or third scroll 10 in the illustration of FIG. 2, is shown outside of second scroll 9 on an outer orbit of scrolling display apparatus 100 in the current exemplary embodiment. At least one of second scroll 9 and second display set 9A and mated third roller 33 and fourth roller 61 are mounted inner more in frame 1A, relative to at least one additional display set 10A comprised of mated rollers prime roller 32 and secondary roller 62 shown in FIGS. 1 and 2. In the present invention, any number of display sets could be provided to scrolling display apparatus 100 by mounting at least one additional scroll display set outside of an inner more scroll display set. In this first exemplary embodiment, while there are three scroll sets shown in the display, any plurality of display sets including scrolls could be utilized with display set apparatus 100. Any additional display set comprised of a mated prime roller and secondary roller coupled with an additional scroll segment can create a new display orbit, by mounting the additional display set and components outside of an inner more display set orbit on display apparatus 100.

Further referring FIG. 2, first scroll 8 is shown with exterior face 21 and interior face 26 and bottom 31 and top 25. Also referring FIG. 2, second scroll 9 is shown with exterior face 20 and bottom 29 and interior face 27 and top 24. Additionally referring FIG. 2, third scroll segment 10 is shown with outer face 22 and top 23 and bottom 30 and interior face 28. A scroll as used in the present exemplary embodiment, may be described by at least one of the terms the terms scroll and scroll segment.

Figure 3:
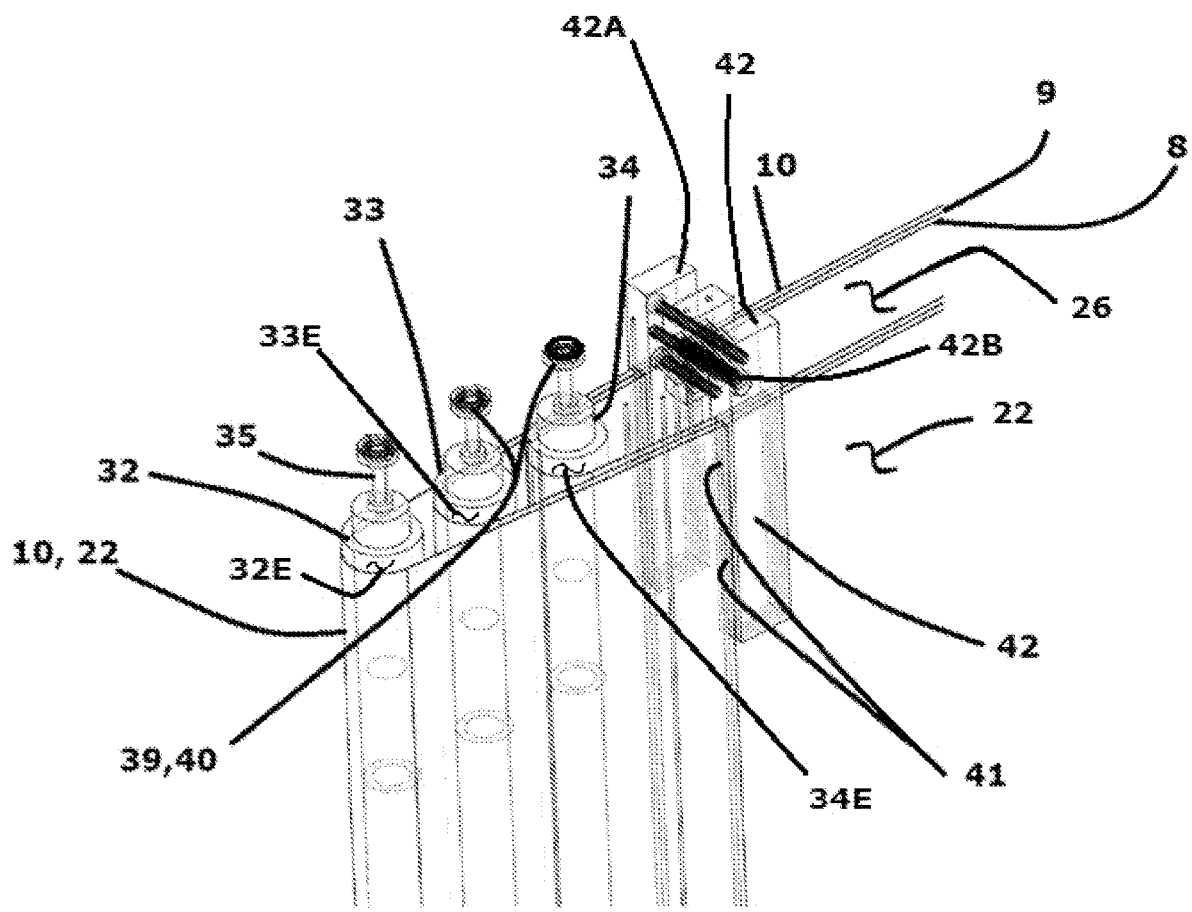
FIG. 3 is a left perspective view of a portion of a scrolling display apparatus according to an exemplary embodiment of the present invention.

Referring FIG. 3, a top left perspective view is shown further illustrating the arrangement of the at least one of the inner most first scroll 8, and the inner more second scroll 9 and the at least on additional scroll 10, in this case a third scroll 10 mounted outside inner more second scroll 9. Further referencing FIG. 3, roller 32 is shown with outer surface 32E in contact with the interior face of third scroll 10, and roller 33 with an outer surface 33E in contact with the inner surface of second scroll 9, and roller 34 with an outer surface 34E in contact with inner surface 26 of first scroll 8. Also referring FIG. 3, guide 42 is shown on the front of scrolling display apparatus 100, and guide 42A is shown on the rear of scrolling display apparatus 100. Guide 42 and 42A guide scrolls 8, 9 and 10 independently to stay in position while the scrolls are at least one of moving and rotating and static. In this first exemplary embodiment, scrolls 8, 9, 10 are thin sheets, such as at least one of plastic and polymer and acrylic and imaged translucent sheet and translucent sheet and partially translucent and elastomeric and flexible and somewhat flexible and others not mentioned here. Further, the imagery and art contained on the imaged scrolls of display apparatus number 100, such as scrolls 8, 9, 10, maybe be developed by at least one of paint, acrylic paint, printing, ink, laser, sintering, holographic and others not mentioned here.

Referring FIG. 3, guides 42 and 42A are fork type guides in this first exemplary embodiment, with four tines and three slots whereby each of scroll sheets 8, 9, and 10 at least one of reside and ride in their independent slot for positioning and guidance. Further, these fork type guides maintain spacing and flow for the scrolls of display apparatus 100. Also referring FIG. 3, guides 42 and 42A are mounted to frame 1A using fasteners such as fasteners 42B, such as nuts and bolts. Bearings 39 and 40 are shown in FIG. 3 and are used to at least one of hold and reduce friction of the rollers rotate. Bearings or rollers of display apparatus 100, such as bearings 39 and 40 of FIG. 3 may be at least one of directly and indirectly mounted in frame 1A.

Figure 4:
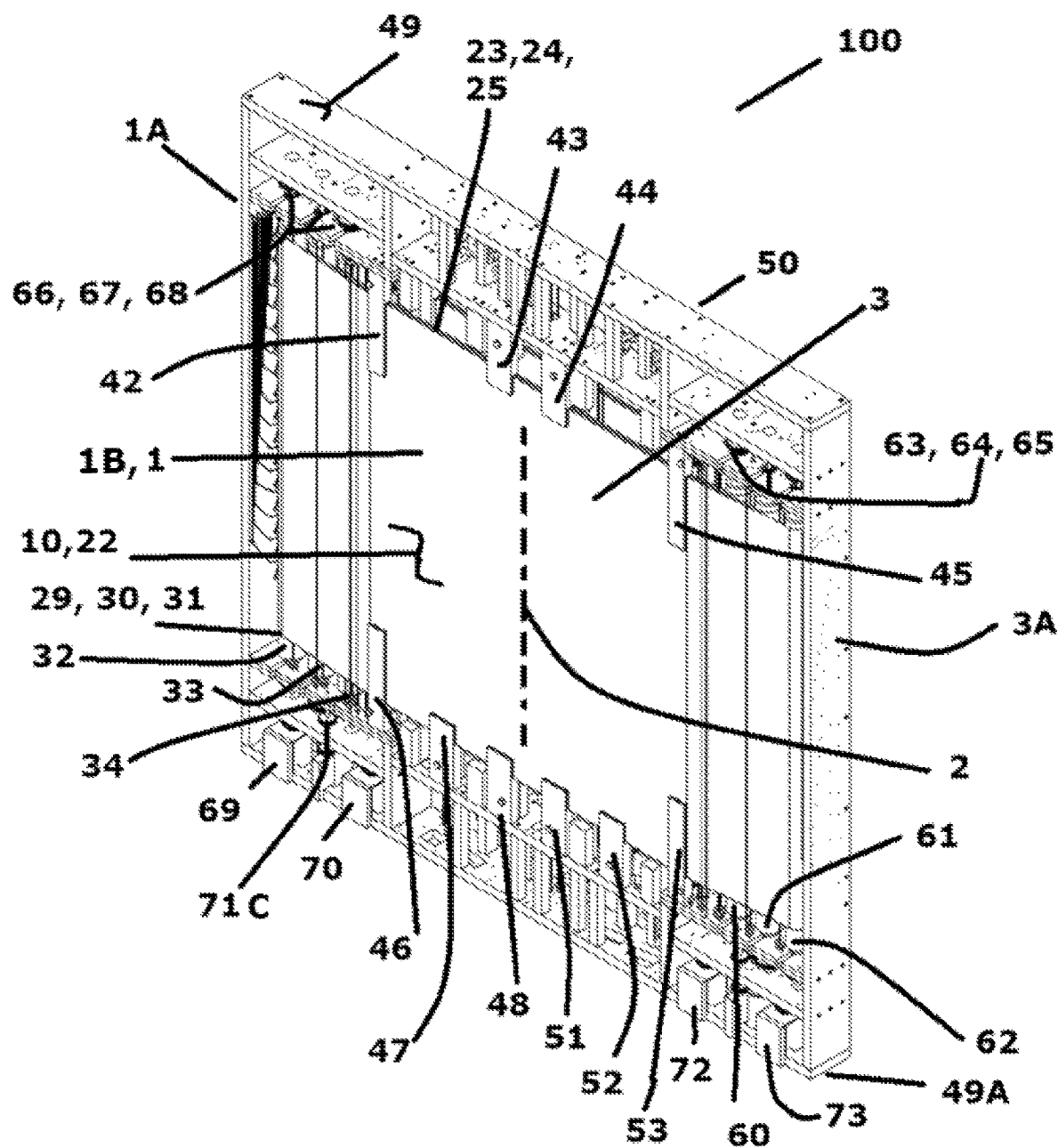
FIG. 4 is a perspective view of a of a scrolling display apparatus, shown according to an exemplary embodiment of the present invention.

Referring FIG. 4, scrolling display apparatus 100 is shown in a front perspective view, such as viewing the front wall 1B of FIG. 1, with left side 1A and first side 1 and frame top wall 49 and scroll sheet tops 23 and 24 and 25, guide 43 and guide 44 and frame back wall 1C and roller mounting 63 and roller mounting 64 and roller mounting 65 and guide 45 and frame top wall 1C and right side 3A and second side 3 and central portion 2 and roller 32 and roller 33 and roller 34 and frame bottom wall 49A and drive 73 and drive 72 and drive 70 and drive 69 and guide 53 in guide 52 and guide 51 and guide 48 guide 47 and guide 46 and drive train 71C and roller 60 and roller 61 and roller 62 and scroll bottom 29 and scroll bottom 30 and scroll bottom 31 and sheet scroll 10 with outer surface 22, and roller mount 66 and roller around 67 and roller mount 68. The top and bottom of the scrolls of display apparatus 100 are edges of the scrolls.

Referring FIG. 4, the bottom wall of display apparatus 100 illustrated by bottom wall 49A, also illustrates that a bottom portion of display apparatus 100 exists and is oriented towards bottom wall 49A in the current exemplary embodiment. The top wall of display apparatus 100, illustrated by top wall 49, also illustrates that a top portion of display apparatus 100 exists and is oriented there towards top wall 49 in the current exemplary embodiment.

Also referring FIG. 4 in this first exemplary embodiment, drive 69 and drive 70 and drive 72 and drive 73 are used to rotate roller 32 and roller 34 and roller 330 and roller 332, respectively, through drive trains of gears. FIG. 4 does not illustrate the additional two drive motors used to drive roller 33 and roller 61 respectively, as these drives are located on the rear of display set apparatus 100 in this first exemplary embodiment. Also referring FIG. 4, while each roller has an individual drive in this illustration to rotate each individual roller independently, as few as one drive could be used to drive all rollers through a drive train. Further referring FIG. 4, roller mountings 66, 67, 68, 63, 64, 65 as shown, illustrate how the rollers mount to frame 1A. Also shown in the mounting areas are the slots cut into frame 1A, whereby the roller and/or roller shafts can be placed and/or removed from frame 1A.

Figure 4A:
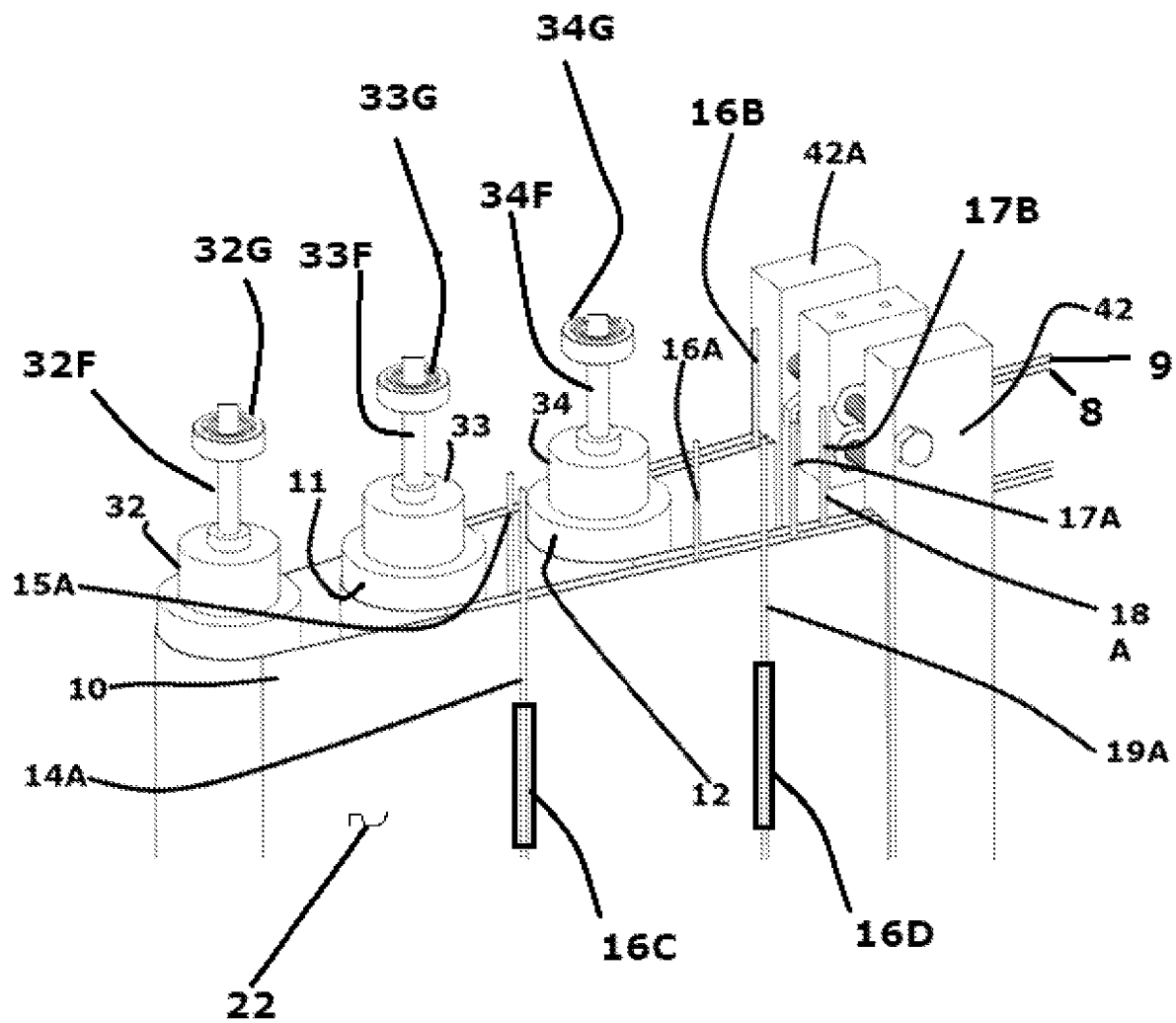
FIG. 4A is a close-up, left perspective view of a portion of a display apparatus according to an exemplary embodiment of the present invention.
Figure 4B:
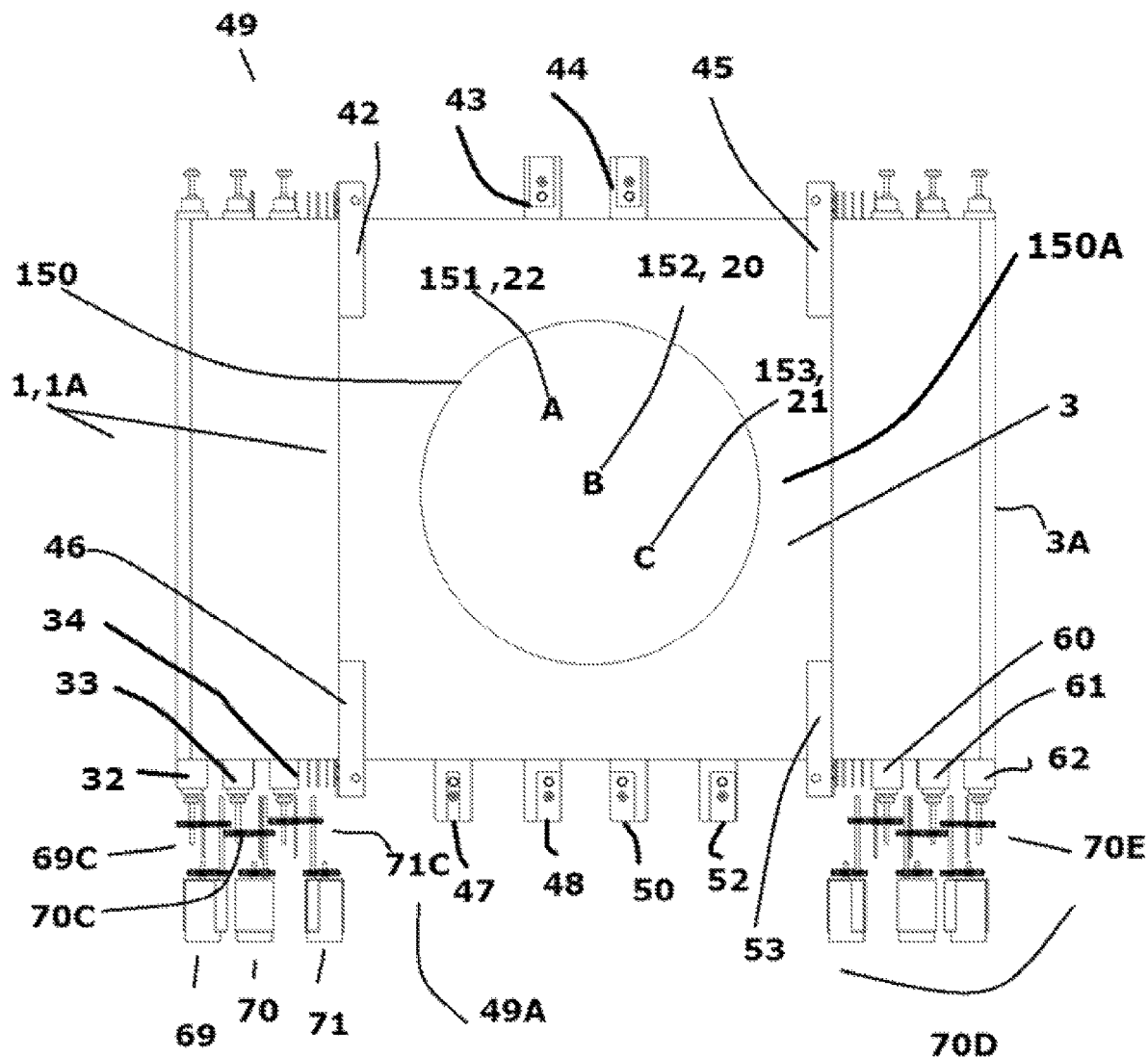
FIG. 4B is a front view of a portion of a scrolling display apparatus, shown without frame, according to an exemplary embodiment of the present invention.
Figure 4C:
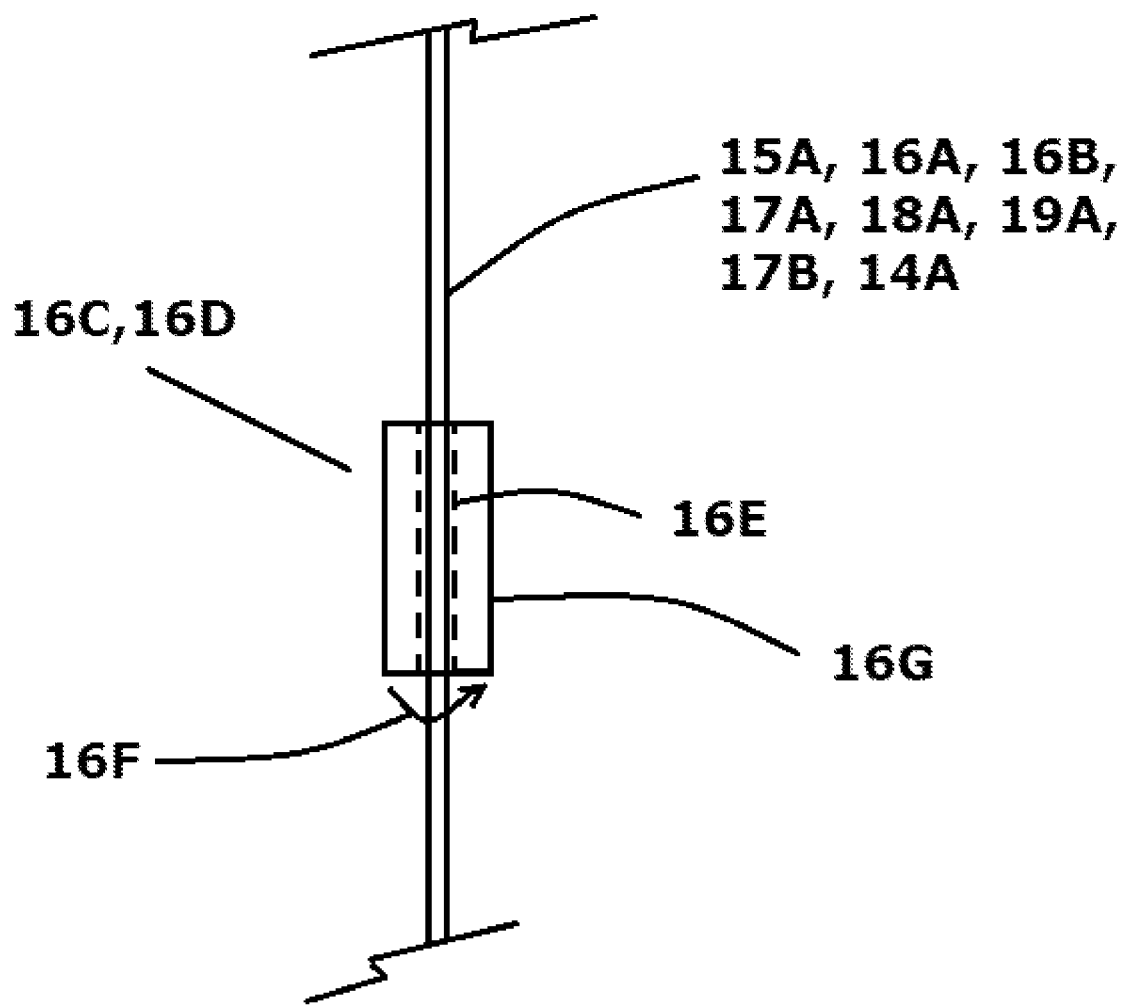
FIG. 4C is a front view of a bearing used with a lead according to an exemplary embodiment of the present invention.

Referring FIG. 4A, a close-up perspective view of the top left portion of scrolling display apparatus 100 is shown with roller 32 and roller shaft 32F and bearing 32G and roller 33 and roller shaft 33F and bearing 33G and roller 34 and roller shaft 34F and bearing 34G and third scroll 10 and second scroll 9 and first scroll 8 and guide 42 and guide 42A and external lead 14A and external lead 19A and internal lead 15A and internal external lead 16A and internal external lead 16B and internal external lead 17B and internal external lead 17A and internal external lead 18A. In this first exemplary embodiment, a lead is used to contact at least one scroll to provide at least one of guidance and tension and positioning of the at least one scroll. In this first exemplary embodiment, a lead may be an external lead such as external lead 14A and external lead 19A of FIG. 4A, whereby external lead 14A and external lead 19A traverse outside of scroll sheet 10 providing contact to outer surface 22 of third scroll sheet 10. In this first exemplary embodiment, a lead may also be an internal lead such as internal lead 15A of FIG. 4A whereby internal lead 15A traverses and contacts the inner surface 27 of second scroll 9.

In this first exemplary embodiment as shown in FIG. 4A, a lead may also be an internal external lead such as internal external leads 16A and 17A, whereby internal external leads 16A and 17A are located internal to third scroll sheet 10 and external to second scroll 9, and may be in contact with at least one of inner surface 28 of third scroll sheet 10 and outer surface 20 of second scroll sheet 9.

Also referring FIG. 4A, internal external leads 18A and 16B are located on the outside of first scroll 8 and on the inside of second scroll 9 and are used to contact at least one of outer surface 21 of first scroll 8 and inner surface 27 of second scroll 9. In this first exemplary embodiment, any lead, whether an internal lead an external lead and/or and internal external lead, may be at least one of a wire and rope and chain and band and elastomer and spring and tube and cable and string and rod and others not mentioned here. In this first exemplary embodiment of display apparatus 100, any lead may be mounted to any portion of the frame, such as mounted to an upper portion of frame 1A and traversing internally therethrough or externally outside/thereabout at least one of first scroll 8 and second scroll 9 and third scroll 10, with the lead having a second connection to frame 1A, such as connected to the lower portion of frame 1A.

Figure 4D:
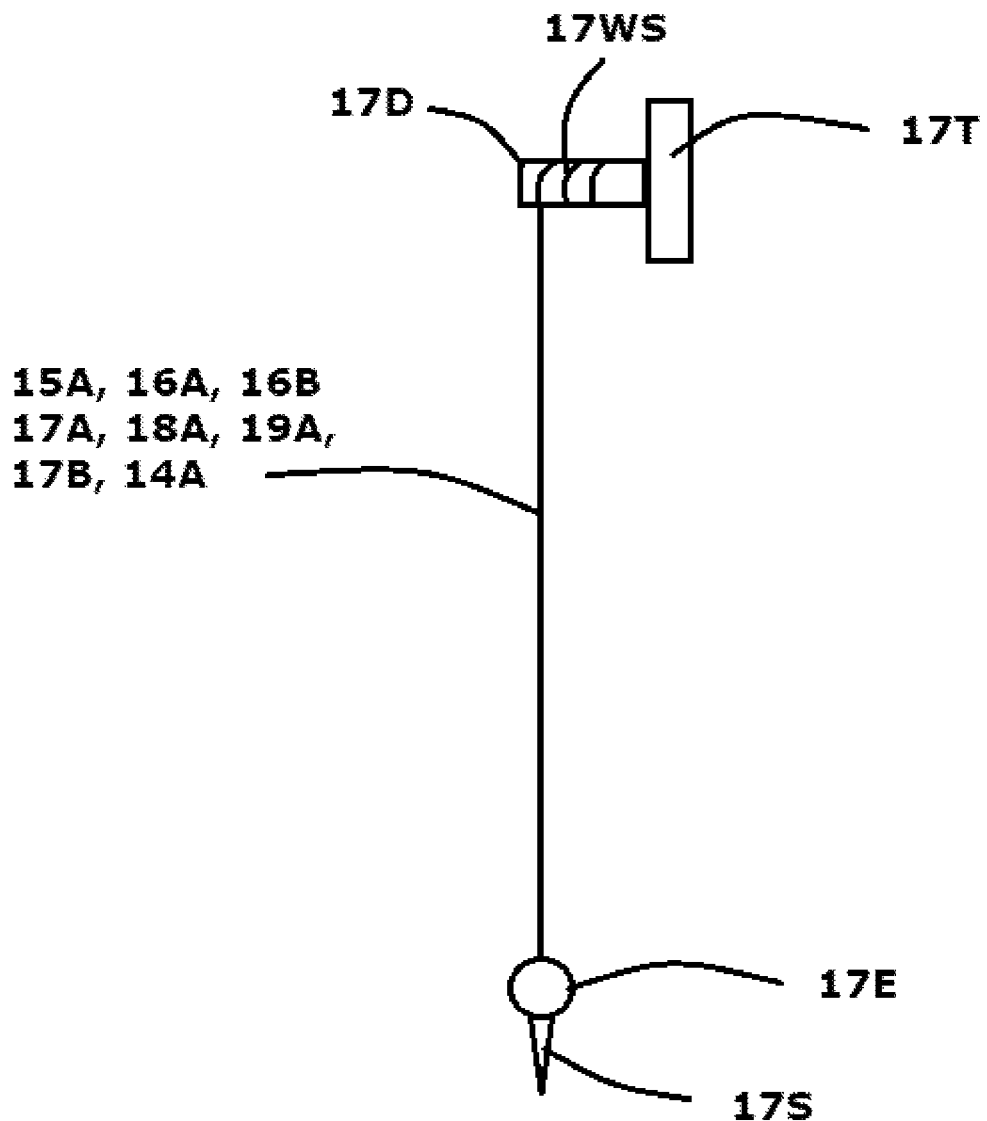
FIG. 4D is a side view of lead and lead tensioner according to an exemplary embodiment of the present invention.
Figure 4E:
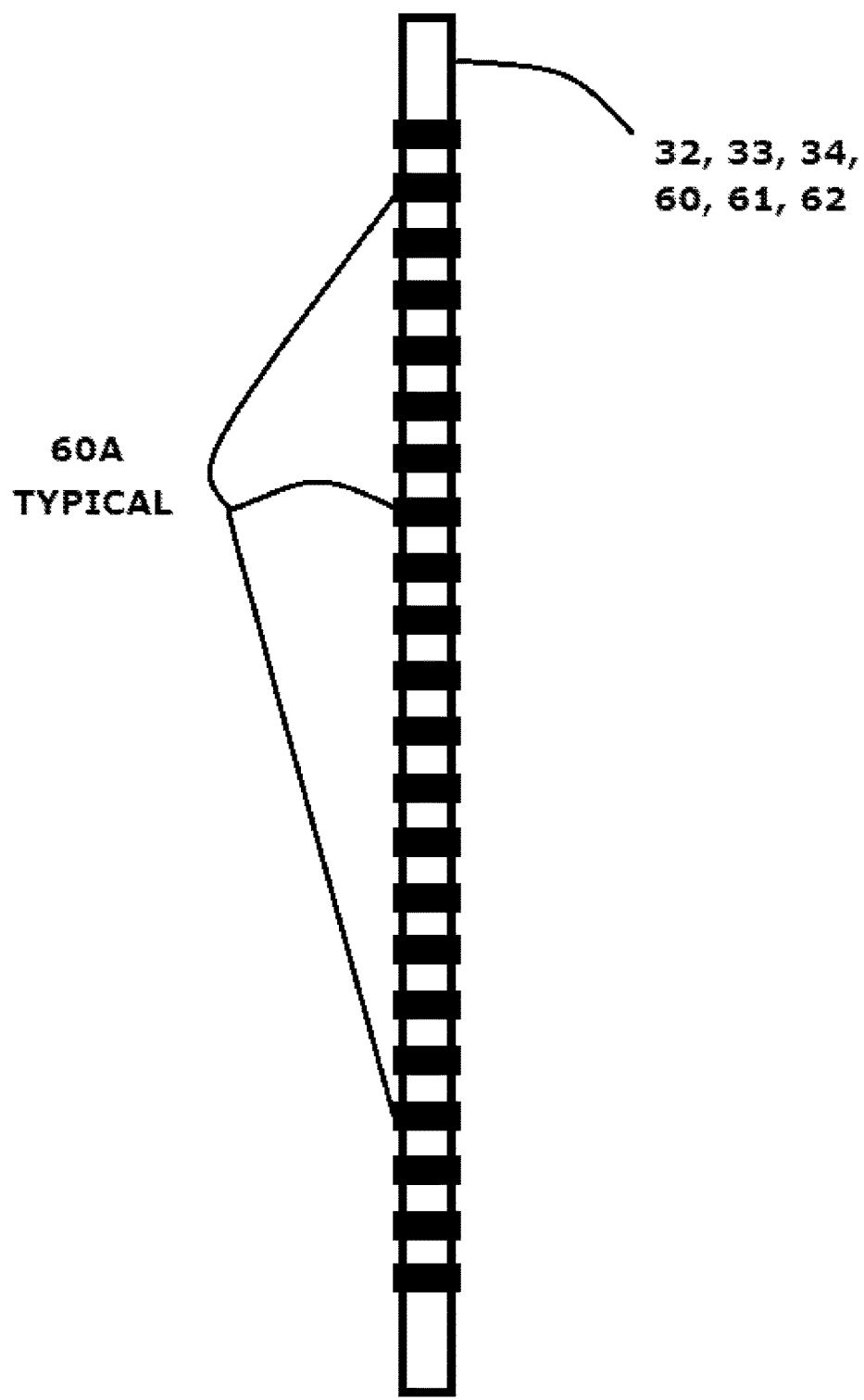
FIG. 4E is a front view of a roller with rubber friction bands added to the outer surface. according to an exemplary embodiment of the present invention.

In this first exemplary embodiment, any lead, such as illustrated in FIGS. 1 and 4A and 4D may be at least one of fixedly and adjustably connected to frame 1A, whereby adjustable connections may include the ability to modify tension in the lead such as by tightening or loosening the lead cable. The tightening and loosening of any lead of display apparatus 100 may be performed by at least one of a winding type tensioner similar to guitar tuning peg and as illustrated by tensioner 17T of FIG. 4D which directly or indirectly connects to frame 1A, whereby leads such as 15A, 16A, 16B, 17A, 18A, 19A, 17B and 14A, may be tensioned by tensioner 17T by the turning of drum 17D and the winding or unwinding of lead cable such as lead tensioner cable 17WS as wound thereunto winding drum 17D. Further referring FIG. 4D, eyelet 17E connects to leads such as leads 15A, 16A, 16B, 17A, 18A, 19A, 17B and 14A, with screw 17S directly or indirectly connecting to frame 1A. Further, any lead of display apparatus 100 may be provided with a quick disconnect to connect and disconnect at least one portion of a lead to and from display apparatus 100.

Referring the leads shown in FIG. 4A, an example of a bearing such as 16C and 16D as shown connected with leads 14A and 19A may be used to reduce friction between any scroll and any lead. A bearing, as used herein, may be at least one of a bushing and a bearing and a lubricant and an intermediary element placed thereunto any lead to reduce friction between the lead and at least one of first scroll 8 and second scroll 9 and third scroll 10 and any additional scroll added to scroll display set apparatus 100.

Referring FIG. 4A, bearings 32G and 33G and 34G are used to reduce the friction of rollers 32 and 33 and 34, respectively, when these rollers are in motion, and these bearings may be mounted directly and/or indirectly thereunto frame 1A. Further Referring FIG. 4A, shafts 32F and 33F and 34F are connected to rollers 32 and 33 and 34, respectively, and are at least one of a holding and rotational axis for the rollers. While rollers 32 and 33 and 34 and 60 and 61 and 62 are shown to be at least one of perpendicular and generally perpendicular to the frame top 49 and bottom 49A, at least one of these rollers could be angled relative to frame top 49 and frame bottom 49A and/or parallel with frame top 49 and frame bottom 49A in scroll display apparatus 100.

In the current exemplary embodiment, while three rotatable sheet scrolls comprised of first scroll 8 and second scroll 9 and at least one additional scroll 10 are illustrated to provide the display of display apparatus 100, at least one of a static and partially static and moving element could be added for display with display apparatus 100, such as at least on portion of the at least one of a static and partially static and moving element being visible through display opening 150 of FIG. 4B. The at least one of a static element and partially static element and moving element could be located at least one of inside and outside and between and in front of and behind any scroll of display apparatus 100, and could be an element such as at least one of a stencil and light and geometric shape or others not mentioned here. The at least one of a static element and partially static element and moving element may generally go in between the scrolling-art and provide art features that separate scrolls and add depth to any art scene. This at least one of a static and partially static and moving component could may be attached to a portion of display apparatus 100, such as at least one of frame 1A and any scroll and any lead and any guide and the front and the back and any side and others not mentioned here, of display apparatus 100. Further, lighting effects such as LED's, glow in the dark elements, colored lighting may be used with display apparatus 100.

Further additionally, while the current illustration of FIG. 4 shows the rollers and display sets of display apparatus 100 at a generally singular depth between frame back 1C and frame front 1A, at least one of the rollers and display sets of display apparatus 100 may optionally be provided with variable depth location capability, such as by manual, motorized and/or any automated motion. Further, while the display set 8A, 9A and 10A are shown oriented in a generally aligned orientation in frame 1A, such as with rollers arranged generally square with the sides of frame 1A, at least one of display sets 8A and 9A and 10A may be oriented at any angle and/or tilted within display apparatus 100 such as angled and/or tilted with respect to the sides of frame 1A. This angled or tilted orientation may be at least one of fixed and adjustable and may be performed by at least one of manual and motorized and automated manipulation.

FIG. 4B shows a front view of the scroll display apparatus 100, and comprises frame top wall 49A and guide 42 and guide 43 and guide 44 and guide 45 and right side 3A and second side 3 and roller 32 and roller 33 and roller 34 and roller 60 and roller 61 and roller 62 and drives 70D and drivetrains 70E and guide 53 and guide 52 and guide 50 and guide 48 and guide 47 and guide 46 and drive 69 and drive 70 and drive 71 and drive train 69C and drive train 70C and drive train 71C and display opening 150 and front cover 150A and imagery 151 of first scroll 9, imagery 152 of second scroll 10, and imagery 153 of at least one additional and third scroll 10, others not mentioned here. In the current exemplary embodiment, top wall 49A represents at least one of a top wall and a top surface and an upper portion and an upper half and others not mentioned here of scroll display apparatus 100.

Further referring FIG. 4B, drives 70D and drivetrains 70E are shown to illustrate that each of rollers 32, 33, 34, 60, 61 and 62 may be provided with their own individual drives for at least one of motion and rotation. In this first exemplary embodiment, each scroll display set comprised of two rollers, such as rollers 32 and 62 and first sheet scroll 8, rollers 33 and 61 and second sheet scroll 9, and/or rollers 34 and 60 and third sheet scroll 10 each rotates independently relative to any other scroll display set. Each scroll display set of display apparatus 100, relative to any other scroll set of display apparatus 100, may have relative rotation and/or motion of at least one of coupled rotation and co-rotation and counter rotation and differing speed and similar speed and not rotated and timed rotation and others not mentioned here.

Referring FIG. 4B, display opening 150 is an illustration of an opening of scroll display set apparatus 100 which allows viewing of at least one portion of imagery from at least one of first scroll sheet 8 and second scroll sheet 9 and third scroll sheet 10 and any additional display scroll sheet added to scroll display set apparatus 100, such as at least one additional scroll segment 10. In this first exemplary embodiment, the sheet scrolls are made of translucent material, such as acrylic and others not mentioned here, whereby imagery on each individual sheet scroll, such as imagery from at least one of one scroll and two scrolls and three scrolls, may be viewable through display opening 150 of FIG. 4B. Further, at least one portion of any scroll of display apparatus 100 may further be partially transparent and opaque and others not mentioned here.

Referring FIG. 4C, a lead of display apparatus 100, such as at least one of lead 15A, 16A, 16B, 17A, 18A, 19A, 17B, and 14A, is shown with bearing 16C and 16D, whereby bearing 16C and 16D has outer surface 16G and inner diameter 16E and rotation ability 16F. Rotation ability 16F illustrates bearing 16C and 16D rotating around at least one of lead 15A, 16A, 16B, 17A, 18A, 19A, 17B, and 14A in this example, whereby outer surface 16G is likely in contact with at least one scroll of display apparatus 100, such as first scroll 8 and second scroll 9 and at least one additional scroll 10. As bearing 16C and 16D rotates about any lead, it develops less friction than if the lead is in direct contact with any moving scroll of display apparatus 100.

Figure 5:
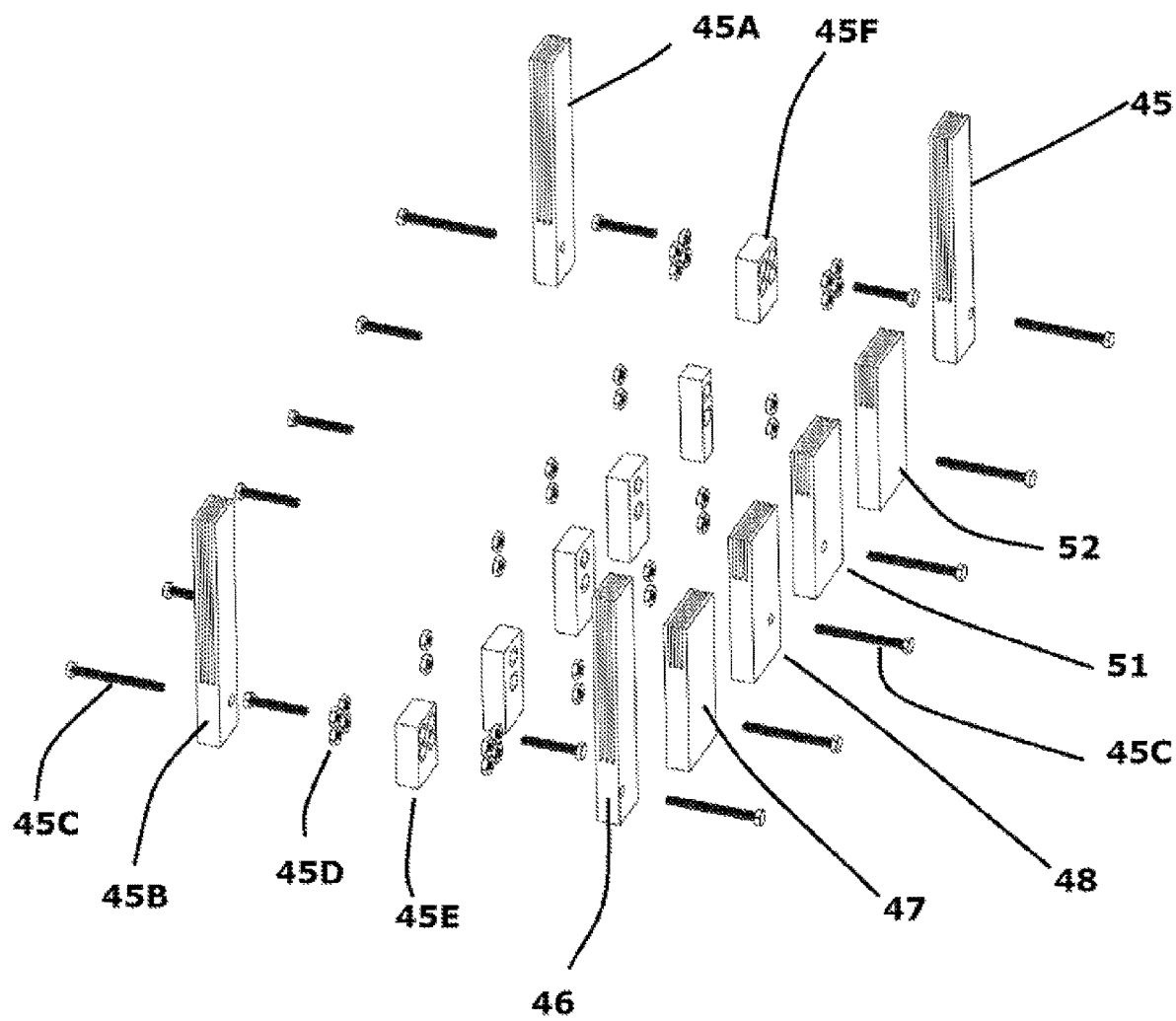
FIG. 5 is an expanded left perspective view of scroll guide components according to an exemplary embodiment of the present invention.

Refer FIG. 5 for a perspective view of a scroll guides as used on display apparatus 100, with guide 45A and guide 45 and guide 51 and guide 48 and guide 47 and guide 46 and guide 45B illustrating guides on the lower portion of display apparatus 100. Also referring FIG. 5 in this exemplary embodiment, the guides are directly or indirectly mounted to frame 1A of scroll display set apparatus 100, such as with typical threaded fasteners illustrated by bolt 45C and nut 45D as shown in the exploded view. Further, a typical spacer block such as 45F and 45E may be utilized for the mounting of any guide of scroll display apparatus 100, such as to provide at least one of proper spacing and support and mounting capability and others not mentioned here for the guides. In this first exemplary embodiment, the guides illustrated in FIG. 5 are three slot four tine fork guides, which provide at least one of independent positioning and guiding of at least one of first scroll sheet 8 and second scroll sheet 9 and at least one additional scroll 10 of display set apparatus 100. The upper guides of display apparatus 100 are similar to the lower guides of display apparatus 100, except the upper guides are generally located on the upper portion of display apparatus 100.

Figure 5A:
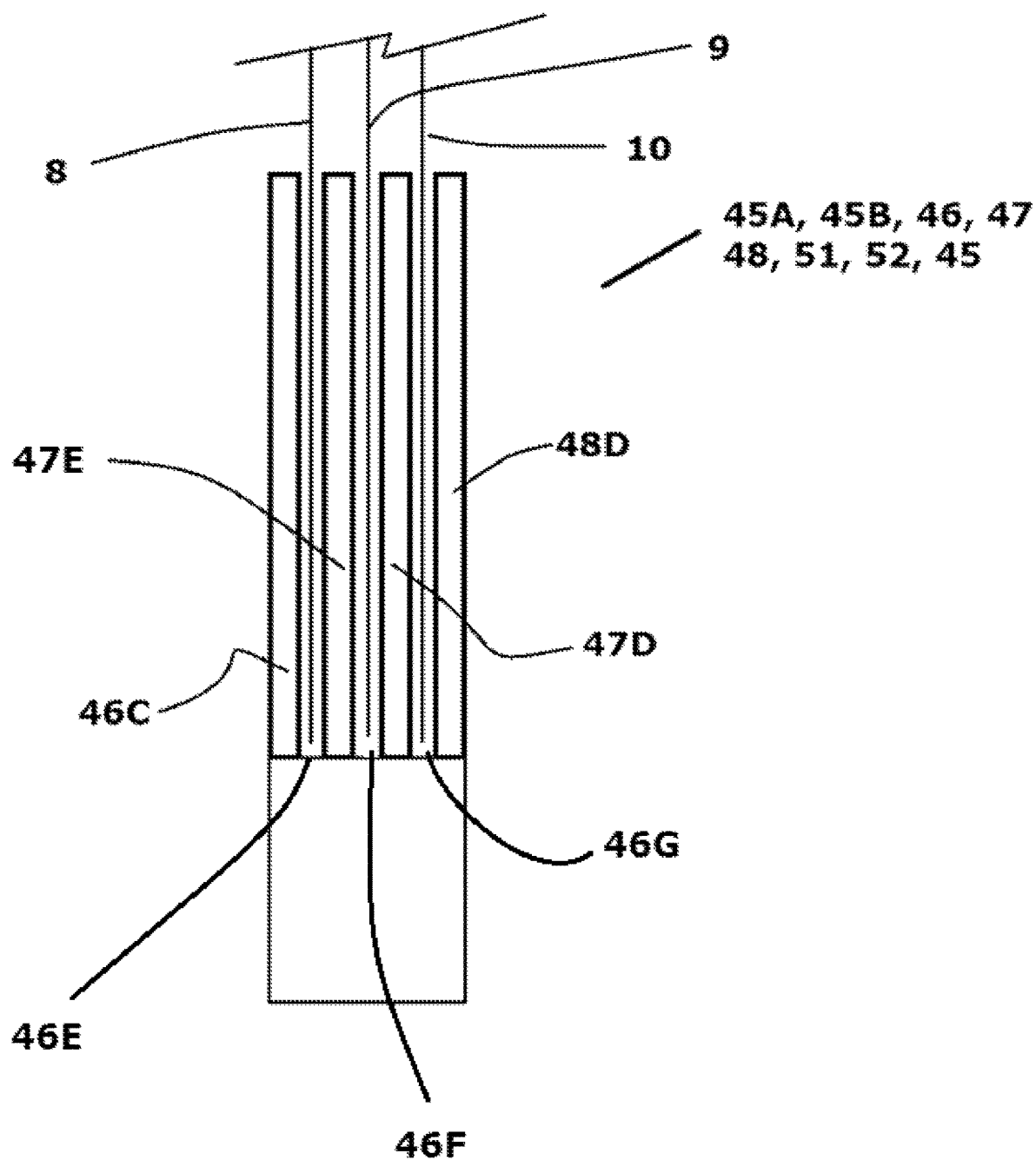
FIG. 5A is a side view of a scroll guide of a scroll display apparatus, such as the guide components presented in FIG. 5, according to an exemplary embodiment of the present invention.

Referring FIG. 5A, guides such as 45A and 45B and 46 and 47 and 48 and 51 and 52 and 45 of FIG. 5 are shown in a side view illustration whereby the first scroll sheet 8 rides in the slot 46E between tine 46C and tine 47E, and second scroll sheet 9 rides in slot 46F between tine 47E and tine 47D, and third scroll sheet 10 rides in slot 46G between tine 47D and tine 48D. The positioning of these scroll sheets with the guide as illustrated in 5A, is a typical illustration of the guides of display apparatus 100 and how the guides provide support and positioning for at least one of first scroll sheet 8 and second scroll sheet 9 and third scroll sheet 10, such as through contact with and scroll outer surface 21 and scroll inner surface 26 and scroll outer surface 20 and scroll inner surface 27 and scroll outer surface 22 and scroll inner surface 28 of scroll display set apparatus 100 of FIG. 2 The guide illustrated in FIG. 5A, would be inverted for use as an upper guide on the upper portion of display apparatus to guide at least one of first scroll 8 and second scroll 9 and at least one additional scroll 10 and others not mentioned here.

Figure 6:
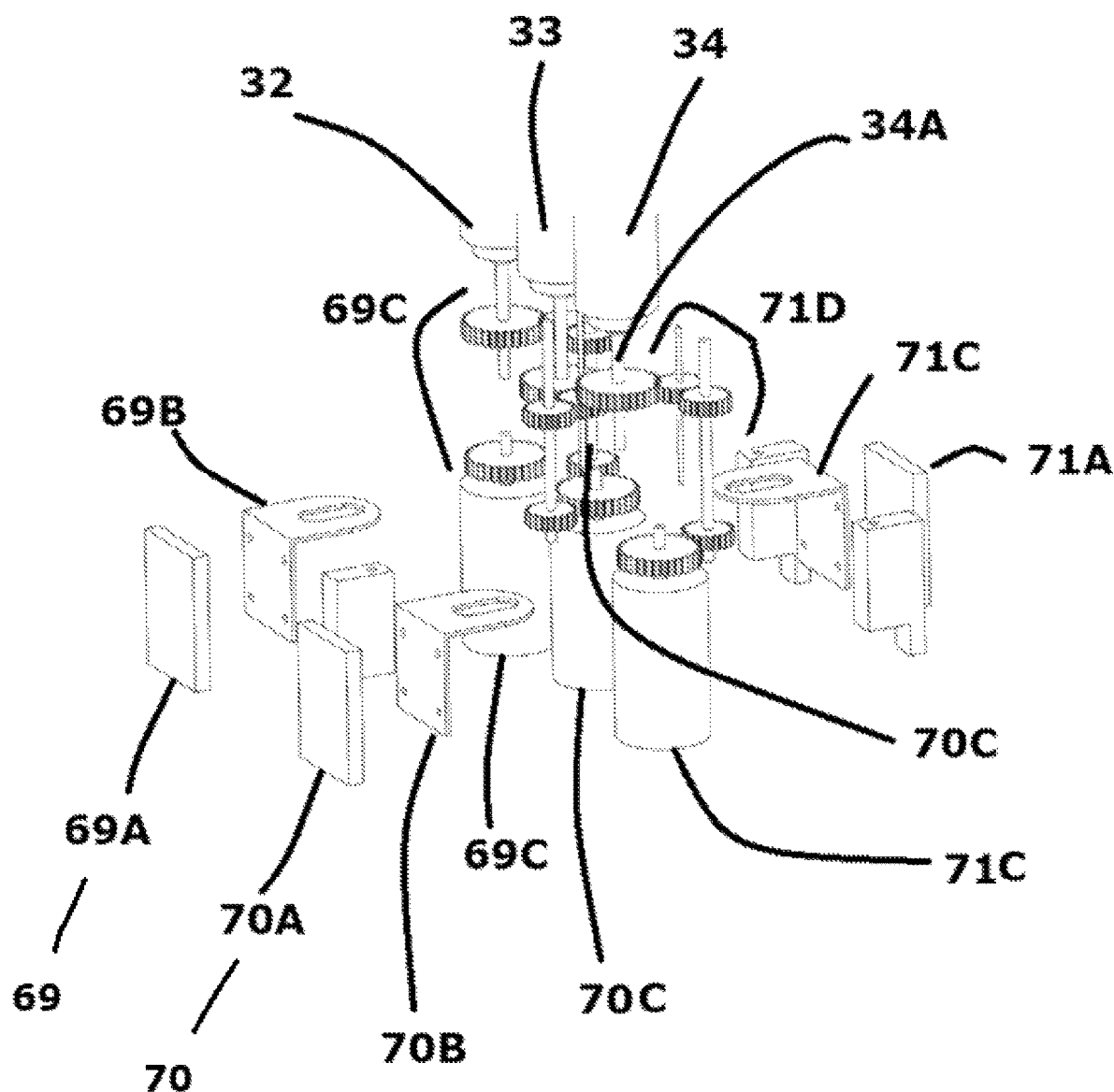
FIG. 6 is a perspective view of display apparatus drive components, according to an exemplary embodiment of the present invention.

Referring FIG. 6, drives 69, 70 and 71 for roller 32 and roller 33 and roller 34 are shown in perspective view, respectively. Motor 69C provides rotational force which is transmitted through drivetrain 69C and to rotate roller 32 as shown in FIG. 6. Motor 70C provides rotational force which is transmitted through drivetrain 70C to rotate roller 33 as shown in FIG. 6. Motor 71C provides rotational force which is transmitted through drivetrain 71D to rotate roller 34 such as through shaft 34A of roller 34. Drive 69 and drive 70, comprising motors 69C and 70C, as well as any drives and/or motor provided to scroll sheet display apparatus 100 in this first exemplary embodiment, may be powered electrically, mechanically and others not mentioned here. Electrically powered may include powered by at least one of alternating current and direct current and battery-powered and others not mentioned here. Other drive types which may be utilized to drive any roller and/or scroll of sheet scroll display apparatus 100 may also include mechanical drives such as weight powered and/or windup and/or spring type and others not mentioned here. Further referring FIG. 6, bands, such as rubber bands may be used to tighten gears and drivetrain together.

Also referring FIG. 6, mounting bracket 69B and mounting bracket 70B and mounting bracket 71C and spacer 69A and spacer 70A and spacer 71A provide the mount of the drives to frame 1A of FIG. 4. Also referring FIG. 6, while drivetrain 69C and drive train 70C and drive train 71D are shown as at least one of geared and reduction geared and multiple geared, the connection of any drive to any roller in sheet scroll display apparatus 100 may alternately be at least one of direct drive and direct coupled and belt driven and magnetically driven and others not mentioned here. Further, motors 69C and 70C and 71C of sheet scroll display apparatus 100 such as shown in FIG. 6, may be at least one of variable speed and variable voltage controlled and variable current controlled and variable frequency controlled and pulsed voltage controlled and others not mentioned here. Further, the control of any drives of display apparatus 100 may be controlled at least one of locally from within display apparatus 100 and remotely such as through wireless control.

Figure 6A:
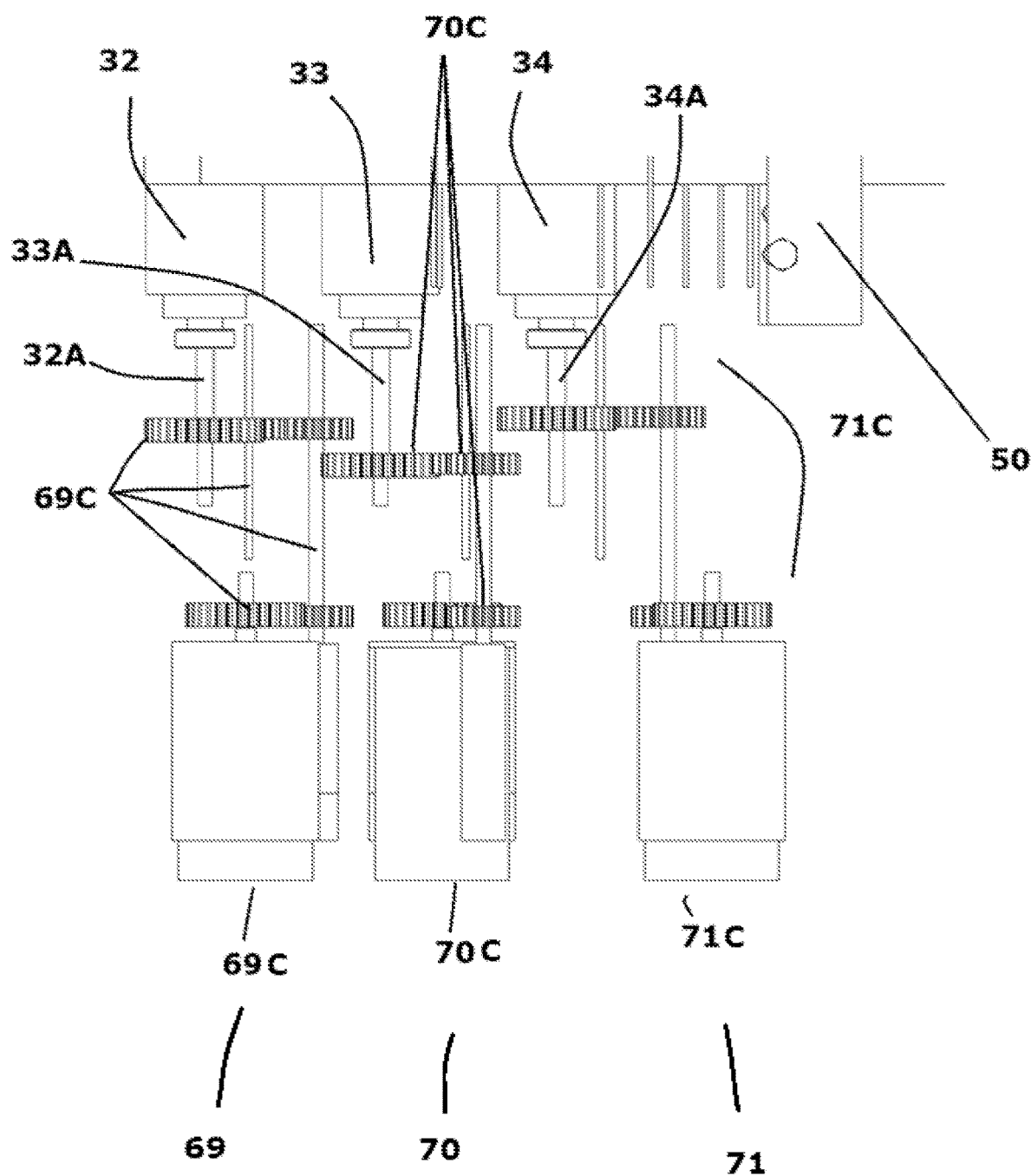
FIG. 6A is a frontal view of drive components of a scrolling display apparatus according to an exemplary embodiment of the present invention.

Referring FIG. 6A, a frontal expanded view of drives 69, 70 and 71 illustrates the driving of roller 32 and roller 33 and roller 34 via drivetrain 69C, drivetrain 70C and drivetrain 71C respectively. In this exemplary embodiment, an independent 6 drive motor system is utilized, whereby in addition to drive 69 and drive 70 and drive 71 driving roller 32 and roller 33 and roller 34, three additional drives 70D of FIG. 4B, are provided to rotate roller 60 and roller 61 and roller 62. Referring FIG. 6A, drivetrain 69C and drivetrain 70C and drivetrain 71C are illustrated with a multi-geared system inclusive of a driver gear and a driven jack shaft and a driven gear affixed to roller shaft 32A and roller shaft 33A and roller shaft 34A, respectively, which in turn independently rotate rollers 32 and roller 33 and roller 34 respectively.

Any portion of display apparatus 100 may be at least one of fractionated and provided with quick connects and/or quick disconnect parts such as to provide easy of assembly and disassembly such as for a do-it-yourself (DIY) approach to build display apparatus 100. As an example of improved assembly and disassembly features of display apparatus 100, referring FIG. 4, mounts 63, 64, 65, 66, 67, and 68 utilize slots in frame 1A simplifying assembly and disassembly of rollers 32, 33, 34, 60, 61, 62 thereto and therefrom display apparatus 100.

What is claimed is:

1. A scrolling display apparatus comprising:
   a frame having a front wall and a back wall and top wall and a bottom wall and a first side and a second side and a central portion interposed between the first side and second side, whereby at least a portion of the frame front wall is at least one of transparent and having a viewing opening formed therein;
   and
   a first scroll display set comprising an inner most first mated roller set comprised of a first roller and second roller whereby the first roller is rotatably mounted between the frame top wall and frame bottom wall on the first side of the frame relative to the frame central portion, the first roller having an outer roller surface;
   and whereby the second roller is rotatably mounted, distal the first roller, between the frame top wall and frame bottom wall on the second side of the frame relative to the frame central portion, the second roller having an outer surface;
   a first imaged scroll having an interior face and an exterior face, the first imaged scroll wound around the first mated roller set with at least one portion of the first imaged scroll interior face in contact with at least one portion of the outer roller surface of the first roller and at least one portion of the outer surface of the second roller, whereby the wound first imaged scroll couples in pulley rotation with the first roller and the second roller in an inner most orbit about the central portion of the frame;
   and
   a second scroll display set mounted outside the first scroll display set, the second scroll display set comprised of a second mated roller set mounted outside the inner most first mated roller set, the second mated roller set comprising a third roller and a fourth roller whereby the third roller is mounted outside the inner most first roller on the first side of the frame relative to the central portion of the frame, the third roller having an outer roller surface; and whereby the fourth roller is rotatably mounted outside the inner most second roller on the second side of the frame relative to the central portion of the frame, the fourth roller having an outer roller surface,
   a second imaged scroll having an interior face and an exterior face, the second imaged scroll wound around at least one portion of outer roller surface of the third roller and the outer roller surface of the fourth roller, whereby the wound second imaged scroll couples in pulley rotation with the second roller and the third roller in a second inner more orbit about the central portion of the frame outside the inner most orbit of the first scroll display set;
   and
   a drive mounted to the frame to at least one of couple to and rotate at least one of the first roller and second roller and third roller and fourth roller and the first imaged scroll and the second imaged scroll;
   and
   at least one lead mounted to the frame, whereby the at least one lead contacts and transmits force to at least one portion of the surface of the first imaged scroll and at least one portion of the second imaged scroll.

2. The apparatus of claim 1 further having at least one additional scroll display set comprising:
   an additional mated roller set comprised of a prime roller and a secondary roller mounted between the top and bottom of the frame outside of an inner more mounted mated roller set, whereby the prime roller is mounted outside of an inner more mounted roller of an inner more mounted roller set on the first side of the frame relative to the central portion of the frame, the prime roller having an exterior surface; and whereby the secondary roller is mounted outside of an inner more roller of an inner more roller set on the second side of the frame relative to the central portion of the frame, and the secondary roller having an exterior surface;
   an imaged scroll segment having an interior face and an exterior fac the imaged scroll segment being wound around at least one portion of the outer roller surface of the prime roller and the outer roller surface of the secondary roller, whereby the wound imaged scroll segment couples in pulley rotation with the prime roller and the secondary roller in an orbit outside any inner more scroll display set relative to the central portion of the frame;
   and
   whereby the at least one lead mounted to the frame contacts at least one of at least one portion of the surface of the first scroll display set and the imaged scroll display set and the at least one additional scroll display set;
   and
   whereby the drive is coupled to drive at least one of any scroll display set and any scroll and any roller.

3. The apparatus of claim 2 whereby at least one portion of the at least one lead traverses therethrough and contacts at least one internal face of at least one of the first wound imaged scroll and the second wound imaged scroll and the at least one additional imaged scroll segment.

4. The apparatus of claim 3 whereby at least one portion of the at least one lead traverses outside of and contacts the exterior face of at least one of the first wound imaged scroll and the second wound imaged scroll and the at least one additional imaged scroll segment.

5. The apparatus of claim 4 whereby the at least one cable lead is mounted to a connection on an upper portion of the frame and a connection on a lower portion of the frame and the bearing can rotate relative to the lead, and whereby adjustment to at least one of the at least one lead and the at least one lead connection on the upper portion of the frame and the at least one lead connection on the lower portion of the frame alters the tension of the at least one cable lead.

6. The apparatus of claim 5 whereby at least one guide is attached to the frame, the guide protruding beyond at least one edge of at least one of the first imaged scroll and the second imaged scroll and the at least one additional imaged scroll segment, whereby the at least one guide guides at least one of the first imaged scroll and the second imaged scroll and the at least one additional imaged scroll segment.

7. The apparatus of claim 6 where the relative rotation between at least one of the first imaged scroll display set and the second imaged scroll display set and the at least one additional imaged scroll display set may be at least one of not rotated and rotated independently and rotated at a different speed and rotated with varying speed and counter rotated and co-rotated.

8. The apparatus of claim 7 whereby the at least one guide has at least one slot for guiding at least one of any scroll and scroll segment.

9. The apparatus of claim 8 whereby the at least lead is at least one of tensioned and loosened using a winding type tensioner.

10. The apparatus of claim 9 whereby at least one roller has at least one friction element.

11. The apparatus of claim 3 whereby the at least one lead is a cable and at least one of rotatable and having a bearing connected to the at least one lead.

12. The apparatus of claim 11 whereby at the least one cable lead is mounted to a connection on an upper portion of the frame and a connection on a lower portion of the frame and the bearing can rotate relative to the lead, and whereby adjustment to at least one of the at least one lead and the at least one connection on the upper portion of the frame and the at least one lead connection on the lower portion of the frame alters the tension of the at least one cable lead.

13. The apparatus of claim 12 whereby at least one guide is attached to the frame, the guide protruding beyond at least one edge of at least one of the first imaged scroll and the second imaged scroll and the at least one additional imaged scroll segment, whereby the at least one guide guides at least one of the first imaged scroll and the second imaged scroll and the at least one additional imaged scroll segment.

14. The apparatus of claim 13 where the relative rotation between at least one of the first imaged scroll display set and the second imaged scroll display set and the at least one additional imaged scroll display set may be at least one of not rotated and dependently rotated and rotated independently and rotated at a different speed and rotated with varying speed and counter rotated and co-rotated.

15. The apparatus of claim 14 whereby the at least one guide has at least one slot for guiding at least one of any scroll and scroll segment.

16. The apparatus of claim 15 whereby the at least lead is at least one of tensioned and loosened using a winding type tensioner.

17. The apparatus of claim 16 whereby at least one roller has at least one friction element.

18. The apparatus of claim 2 whereby at least one portion of the at least one lead traverses outside of and contacts the exterior face of at least one of the first wound imaged scroll and the second wound imaged scroll and the at least one additional imaged scroll segment.

19. The apparatus of claim 18 whereby the at least one lead is a cable and at least one of rotatable and having at least one bearing connected to the at least one lead.

20. The apparatus of claim 19 whereby the at least one cable lead is mounted to a connection on an upper portion of the frame and a connection on a lower portion of the frame and the bearing can rotate relative to the lead, and whereby adjustment to at least one of the at least one lead and the at least one lead connection on the upper portion of the frame and the at least one lead connection on the lower portion of the frame alters the tension of the at least one cable lead.

21. The apparatus of claim 19 whereby at least one guide is attached to the frame, the guide protruding beyond at least one edge of at least one of the first imaged scroll and the second imaged scroll and the at least one additional imaged scroll segment, whereby the at least one guide guides at least one of the first imaged scroll and the second imaged scroll and the at least one additional imaged scroll segment.

22. The apparatus of claim 21 where the relative rotation between at least one of the first imaged scroll display set and the second imaged scroll display set and the at least one additional imaged scroll display set may be at least one of not rotated and rotated independently and rotated at a different speed and rotated with varying speed and counter rotated and co-rotated.

23. The apparatus of claim 22 whereby the at least one guide has at least one slot for guiding at least one of any scroll and scroll segment.

24. The apparatus of claim 23 whereby the at least lead is at least one of tensioned and loosened using a winding type tensioner.

25. The apparatus of claim 24 whereby at least one roller has at least one friction element.

26. The apparatus of claim 21 whereby any imaged scroll of any display set winds around one roller of a mated roller set and rewinds from the other roller of the mated roller set.

27. The apparatus of claim 26 whereby the at least one guide has at least one slot for guiding at least one of any scroll and scroll segment.

28. The apparatus of claim 27 whereby the at least lead is at least one of tensioned and loosened using a winding type tensioner.

29. The apparatus of claim 28 whereby at least one roller has at least one friction element.

30. The display apparatus of claim 29, wherein a plurality of slotted guides are attached to the frame, the guides protruding beyond at least one edge of any scroll and any scroll segment, whereby plurality of guides guide the motion of any imaged scroll and any imaged scroll segment;
and
bearings are connected to the cable leads and the bearing can rotate thereon the lead cable;
and winding type drums are connected to the plurality of cable leads and increase and decrease tension of the lead cables through winding and unwinding the cable leads, respectively;
and at least one roller has a friction element on its outer surface;
and
the relative rotation between at least one of the first scroll display set and the second scroll display set and the at least one additional scroll display set may be at least one of rotated independently and rotated at a different speed and rotated with varying speed and counter rotated and co-rotated.

31. A scrolling art display apparatus comprising:
a frame having a front wall and a back wall and top wall and a bottom wall and a first side and a second side and a central portion interposed between the first side and second side, whereby at least a portion of the frame front wall is at least one of transparent and partially transparent and having a viewing opening formed therein;

a first scroll display set mounted in the frame comprising a first mated roller set comprised of a first roller and second roller whereby the first roller is rotatably mounted between the frame top wall and frame bottom wall on the first side of the frame relative to the frame central portion, the first roller having an outer roller surface, and whereby the second roller is rotatably mounted, distal the first roller, between the frame top wall and frame bottom wall on the second side of the frame relative to the frame central portion, the second roller having an outer surface;

a first imaged scroll having an Interior face and an exterior face with at least one portion of the first imaged scroll being translucent, the first imaged scroll wound around the first mated roller set with at least one portion of the first imaged scroll interior face in contact with at least one portion of the outer roller surface of the first roller and at least one portion of the outer surface of the second roller, whereby the wound first imaged scroll couples in pulley rotation with the first roller and the second roller in an inner most orbit about the central portion of the frame;

and a second scroll display set mounted in the frame outside the first scroll display set, comprising a second mated roller set mounted outside the inner most first mated roller set, the second mated roller set comprising a third roller and a fourth roller whereby the third roller is mounted outside the inner most first roller on the first side of the frame relative to the central portion of the frame, the third roller having an outer roller surface, and whereby the fourth roller is rotatably mounted outside the inner most second roller on the second side of the frame relative to the central portion of the frame, the fourth roller having an outer roller surface, a second imaged scroll having an interior face and an exterior face with at least one portion of the second imaged scroll having translucency, the second imaged scroll wound around at least one portion of outer roller surface of the third roller and the outer roller surface of the fourth roller, whereby at least one portion of the interior face of the second imaged scroll contacts at least one portion of the outer roller surface of the third roller and at least one portion of the outer surface of the fourth roller, whereby the wound second imaged scroll couples in pulley rotation with the second roller and the third roller in a second innermost orbit about the central portion of the frame outside the inner most orbit of the first scroll display set;

and at least one additional scroll display set further comprising a roller set comprised of a prime roller and a secondary roller mounted between the top and bottom of the frame outside any inner more mounted mated roller set, whereby the prime roller is mounted outside of an inner more mounted roller of an inner more mounted roller set on the first side of the frame relative to the central portion of the frame, the prime roller having an exterior surface, and whereby the secondary roller is mounted outside of an inner more roller of an inner more roller set on the second side of the frame relative to the central portion of the frame, and the secondary roller having an exterior surface;

an imaged scroll segment having an interior face and an exterior face with at least one portion of the imaged scroll segment translucency, the imaged scroll segment being wound around at least one portion of the outer roller surface of the prime roller and the outer roller surface of the secondary roller, whereby the wound imaged scroll segment couples in pulley rotation with the prime roller and the secondary roller in an orbit outside any inner more scroll display set relative to the central portion of the frame;

and a plurality of cable leads that traverse and contact at least one of the outside face and inside face of any imaged scroll and any additional imaged scroll segment; and at least one drive proving motion of at least one of any imaged scroll display set and any imaged scroll and any roller.

32. The display apparatus of claim 31 further comprising at least one of a static element and partially static element and moving element located at least one of in front of and behind and between at least one of any imaged scroll and imaged scroll segment.

* * * * *